(12) United States Patent
Zheng et al.

(10) Patent No.: US 6,480,428 B2
(45) Date of Patent: Nov. 12, 2002

(54) REDUNDANT CIRCUIT FOR MEMORY DEVICE

(75) Inventors: Hua Zheng, Fremont; Jae-Hyeong Kim, San Jose, both of CA (US)

(73) Assignee: Winbond Electronics Corporation, Hsin Chu (TW)

( * ) Notice: Subject to any disclaimer, the term of this patent is extended or adjusted under 35 U.S.C. 154(b) by 0 days.

(21) Appl. No.: 09/740,712

(22) Filed: Dec. 19, 2000

(65) Prior Publication Data

US 2002/0075733 A1 Jun. 20, 2002

(51) Int. Cl.[7] .................................................. G11C 7/00
(52) U.S. Cl. ................ 365/200; 365/225.7; 365/230.03
(58) Field of Search .............................. 365/200, 225.7, 365/230.03, 189.01, 230.01

(56) References Cited

U.S. PATENT DOCUMENTS 5,596,536 A * 1/1997 Koh ........................... 365/200
5,923,682 A * 7/1999 Seyyedy ..................... 714/766
6,201,733 B1 * 3/2001 Hiraki et al. ............. 365/185.08
6,282,689 B1 * 8/2001 Seyyedy ..................... 714/773

* cited by examiner

Primary Examiner—Hoai Ho
(74) Attorney, Agent, or Firm—Dinh & Associates (57) ABSTRACT

A redundant circuit that includes a combination of fuses and anti-fuses, and which may be used during various phases of the manufacturing process (e.g., during wafer test or final test) to replace a defective circuit. The redundant circuit includes (1) a replacement circuit (e.g., a redundant memory cell) that is configurable to replace a defective circuit, and (2) supporting circuitry for the replacement circuit. The support circuit is configurable to provide a control signal (e.g., to activate a word line) for the replacement circuit and further includes at least one fuse and at least one anti-fuse. The fuses or anti-fuses may be programmed to provide a programmed value (e.g., a programmed address) for the replacement circuit. The redundant circuit can be efficiently fabricated within a memory device, and may also be used for other circuits and applications.

26 Claims, 9 Drawing Sheets

REDUNDANT CIRCUIT FOR MEMORY DEVICE

BACKGROUND OF THE INVENTION

The present invention relates generally to integrated circuits, and more particularly to a redundant circuit that may be used to replace a defective memory cell in a memory device.

Memory devices are integral to computer systems and many electronic circuits. Continuous improvements in the operating speed and computing power of central processing units (CPUs) enable the operation of an ever-greater variety of applications, many of which require larger and faster memories. Larger memories are characterized by having more memory cells to store more bits of data.

The manufacturing process for larger memory devices is very challenging, especially as the number of memory cells increases and the size of the memory cells decreases. In fact, it is common to have one or more defective memory cells in any given manufactured memory device. For costs and other considerations, it is impractical to reject an entire memory device if only a few of the cells are actually defective. Thus, to increase production yields, redundant memory cells are typically fabricated within each memory device. During the production and/or testing phase, the cells in the memory device are tested and any cell identified as defective is replaced with a redundant cell.

To replace a defective cell with a redundant cell, the address of the defective cell is effectively changed such that if the address of this cell is selected, the redundant cell is internally selected in its place. In this way, if the address of the defective cell is selected during normal device operation, the alternative lines (e.g., the word line and/or column select line) for the redundant cell are selected instead of the lines for the defective cell.

Several techniques are available to "program" the address of a redundant cell to replace a defective cell. In one technique, the address of the redundant cell is programmed by blowing selective ones of a set of fuses provided for the cell. Another "master" fuse may also be blown to indicate that the redundant cell has been programmed for use. In another technique, the address of the redundant cell is programmed by shorting selective ones of a set of anti-fuses provided for the cell.

Fuses are typically fabricated with metal lines or polysilicon, and are typically blown using a laser (which is a preferred method) or some other technique. For the laser technique and since a fuse needs to be physically exposed to the laser to be blown, the programming of the fuses for a redundant memory cell is typically only performed during wafer testing (i.e., prior to packaging the memory device). In contrast, an anti-fuse can be electrically shorted, and the programming of the anti-fuses for a redundant cell is typically performed during package testing.

Fuses are thus not as flexible because they can only be programmed during wafer testing, but their smaller size makes them attractive. Anti-fuses are more flexible and can be programmed during final testing, but their larger size (e.g., 3 to 4 times the die area of fuses) makes them more costly.

For flexibility and improved production yields, a memory device may be fabricated with one set of redundant memory cells that can be programmed with fuses and another set of redundant cells that can be programmed with anti-fuses. The redundant cells with fuses can be used to replace defective cells detected during wafer testing, which may account for approximately 90% of all defective cells on the memory device. And the redundant cells with anti-fuses can be used to replace any remaining defective cells during package testing (i.e., defective cells not detected or replaced during wafer testing).

One of the challenges in the design of a memory device is the selection and allocation of the number of redundant memory cells with fuses and anti-fuses to be included in the device. If too many redundant cells are provided but not used, the additional die area for these cells and their support circuitry unnecessarily increases the costs for the memory device. If not enough redundant cells are provided, more defective devices that cannot be repaired may be thrown out, which would decrease production yields and also increase costs. For a given number of redundant cells, if more redundant cells with fuses are allocated, the number of defective cells that may be repaired during package testing is reduced. And if more redundant cells with anti-fuses are allocated, the larger size of the anti-fuses increases the die area and costs of the device.

As can be seen, a redundant circuit that can be effectively used to replace a defective memory cell in a memory device, and which may improve the yields and costs of the memory device, is highly desirable.

SUMMARY OF THE INVENTION

The invention provides a redundant circuit that includes a combination of fuses and anti-fuses, and which may be used during various phases of the manufacturing process (e.g., during wafer test or final test) to replace a defective circuit. For an implementation in a memory device, the redundant circuit includes a "fuse and anti-fuse" circuit, an address comparator, and a redundant cell. In a general sense, the redundant circuit includes (1) a replacement circuit (e.g., a memory cell) that can be used to replace a defective circuit, and (2) supporting circuitry for the replacement circuit, which includes a combination of fuses and anti-fuses. The redundant circuit of the invention can be efficiently fabricated within a memory device, and may also be used for other circuits and applications.

An embodiment of the invention provides a redundant circuit that includes a replacement circuit and a support circuit. The replacement circuit (e.g., a redundant memory cell) is configurable to replace a defective circuit. The support circuit is configurable to provide a control signal (e.g., to activate a word line) for the replacement circuit and further includes at least one fuse and at least one anti-fuse. The fuse or anti-fuse may be programmed to provide a programmed value (e.g., a programmed address) for the replacement circuit.

In one specific design, the support circuit may be designed to include first, second, and third circuits (e.g., a anti-fuse circuit, a fuse latch, and an address comparator, respectively). The first circuit includes the anti-fuse, and is further configurable to program the anti-fuse or sense the state of anti-fuse. The second circuit includes the fuse, and is further configurable to sense the state of the fuse, receive the sensed state of the anti-fuse, and provide the programmed value indicative of the sensed states of the fuse and anti-fuse. The third circuit receives the programmed value, compares the programmed value with an external value (e.g., an external address), and provides the control signal for the replacement circuit based on the result of the comparison and the status of the redundant circuit (i.e., whether or not it has been programmed to replace the defective circuit).

The redundant circuit and methods described herein can be advantageously implemented within an integrated circuit, a DRAM device, and other devices. Various other aspects, embodiments, and features of the invention are described in further detail below.

The foregoing, together with other aspects of this invention, will become more apparent when referring to the following specification, claims, and accompanying drawings.

DESCRIPTION OF THE SPECIFIC EMBODIMENTS

For clarity, the redundant circuit of the invention is described for a specific implementation in a memory device. However, the specific details are intended to be illustrative, and not limitations, of the present invention. It will be recognized that alternative implementations, modifications, and variations of the circuits and architectures described herein can be made and are within the scope of the invention. For example, the invention can be designed to satisfy a particular set of requirements, for implementation in other types of integrated circuits besides a memory device, and so on.

Figure 1:
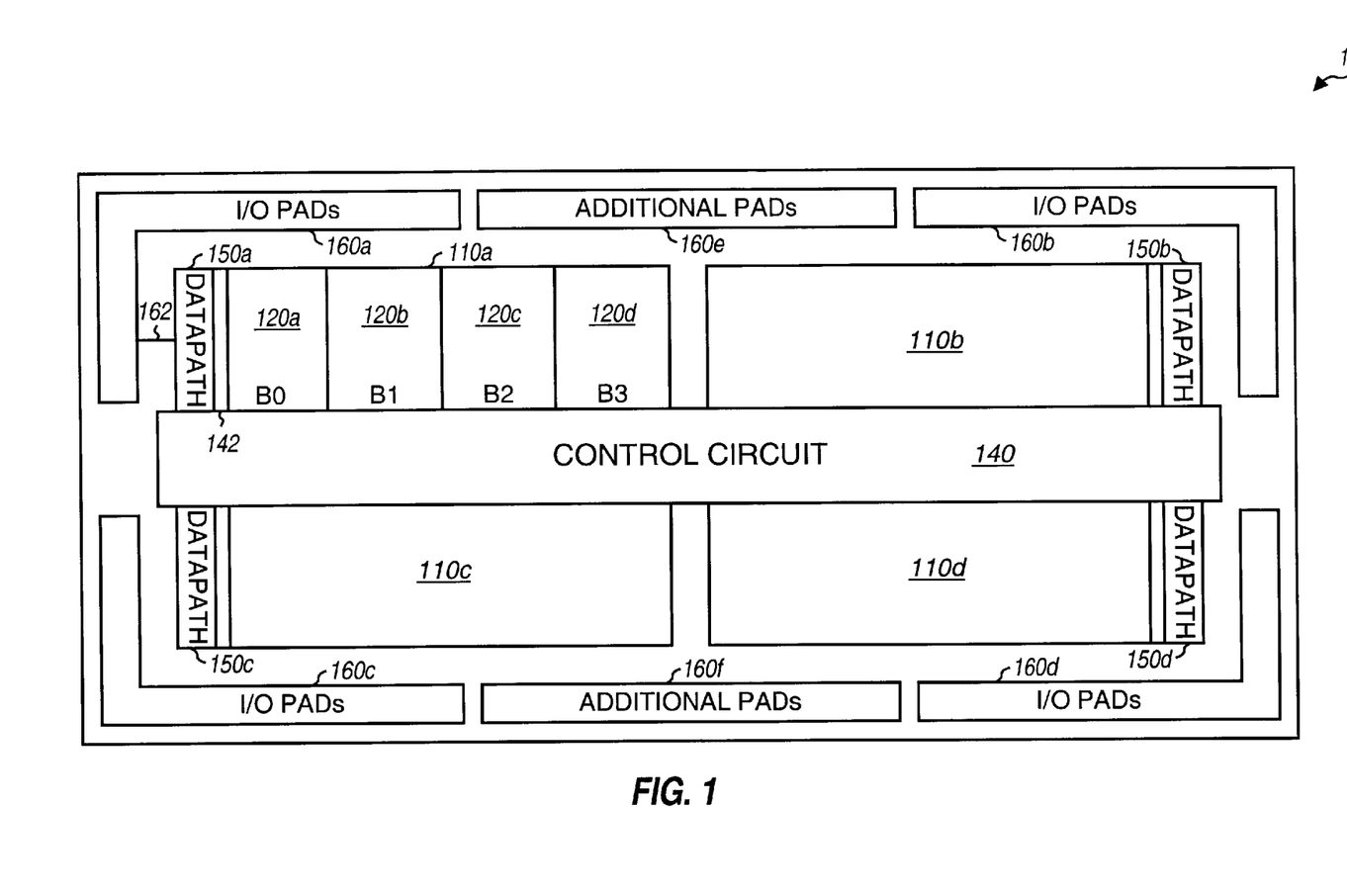
FIG. 1 is a diagram of a specific embodiment of a memory device.

FIG. 1 is a diagram of a specific embodiment of a memory device 100. In this embodiment, memory device 100 includes four memory arrays 110a through 110d, with each memory array 110 including four memory banks 120a through 120d. A control circuit 140 couples to memory arrays 110a through 110d and provides the necessary control signals, clock signals, and reference voltages. Additional control and support circuitry may be dispersed throughout memory device 100. Some of these circuits are described below, as necessary for the understanding of the invention.

As shown in FIG. 1, each memory array 110 is associated with a datapath 150 that interconnects the memory cells in the memory array to an associated set of data input/output (I/O) pads 160. Each data I/O pad 160 couples to a respective data I/O pin for memory device 100. The I/O pads and I/O pins are also referred to as DQ pads and DQ pins, respectively. Additional pad sections 160e and/or 160f may be provided for control signals, clock signals, address lines, power supplies, ground, and other inputs and outputs.

Generally, the memory device may include greater or fewer number of memory arrays, each memory array may include greater or fewer number of memory banks. Also, the memory device may be configured differently than that shown in FIG. 1. In certain embodiments, memory device 100 is DRAM device having at least 64 million bits (Mbits) of memory, and each memory array includes at least 16 Mbits of memory.

Each memory array 110 includes memory cells for many data bits. The memory cells are typically arranged in a two-dimensional array. A word line selects a particular row within the memory array, and a column select line selects a particular column. Thus, each memory cell is identified by a unique combination of word line and column select line. A set of word line drivers associated with each memory array activates the word lines for that memory array, and a column decoder 142 associated with each memory array activates the column select lines for that memory array. The word line drivers and portions of the column decoders are implemented within control circuit 140. The word lines and column select lines are activated in accordance with the memory addresses provided by a source external or internal to the memory device.

In an embodiment, the memory cells in each memory bank are arranged into a number of segments, with each segment corresponding to a particular set of memory addresses. This segmented design can be advantageously used to support access of multiple data bits within a single "active" clock cycle. For a multi-bit memory access, two or more data bits may be retrieved from, or written to, two or more segments for each clock cycle. For example, to concurrently access two bits within a clock cycle, the memory bank may be partitioned into odd and even segments, with the odd segment including memory cells having odd-numbered addresses and the even segment including memory cells having even-numbered addresses.

Several segmented memory designs are described in detail in U.S. Pat. No. 6,094,396, entitled "Memory Array Architecture for Multi-Data Rate Operation," issued Jul. 25, 2000, and U.S. patent application Ser. No. 09/235,222, entitled "Memory Array Architecture Supporting Block Write Operation," and filed Jan. 22, 1999. A design of a datapath that supports a number of operating modes is disclosed in U.S. patent application Ser. No. 09/236,509, entitled "Memory Array Datapath Architecture," and filed Jan. 25, 1999. These patent and patent applications are assigned to the assignee of the present invention and incorporated herein by reference.

Figure 2:
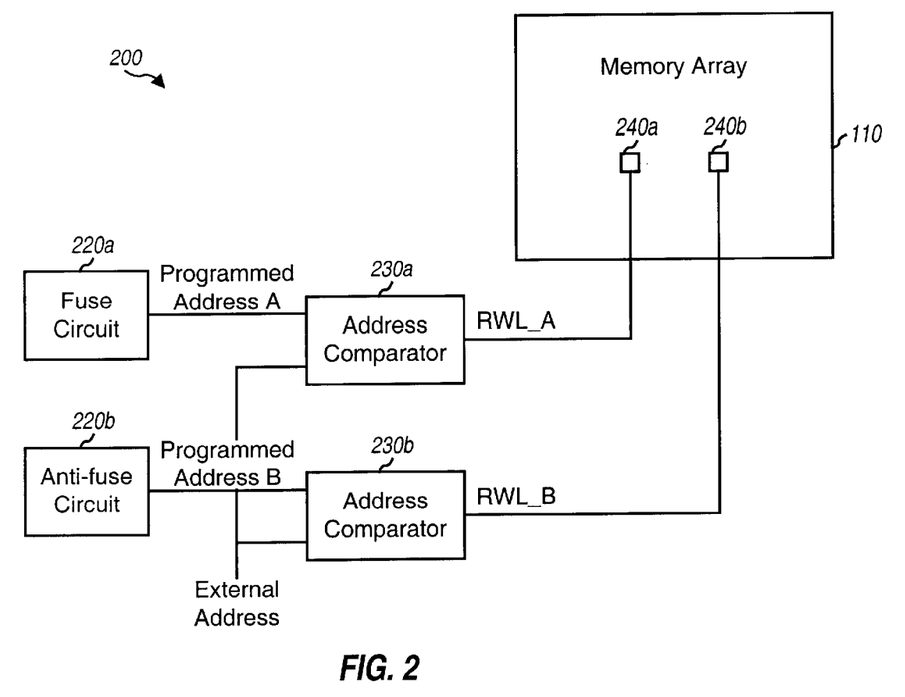
FIG. 2 is a block diagram of a memory array architecture that employs (illustratively) two redundant memory cells, with the address for one cell being programmable with fuses and the address for the other cell being programmable with anti-fuses.

FIG. 2 is a block diagram of a memory array architecture 200 that employs (illustratively) two redundant memory cells, with one cell being programmable with fuses and the other cell being programmable with anti-fuses. In the example shown in FIG. 2, a fuse circuit 220a includes a set of fuses that may be programmed (i.e., blown or not blown) to represent the address of a defective cell to be replaced. Fuse circuit 220a further includes supporting circuitry that provides a programmed address for a redundant cell 240a based on the programmed state of the fuses. An address comparator 230a receives the programmed address from fuse circuit 220a and an external address, compares the two addresses, and activates a first word line RWL_A for redundant memory cell 240a if the two addresses match. Although not shown in FIG. 2 for simplicity, additional support circuitry is provided to turn OFF the defective cell being replaced.

Similarly, an anti-fuse circuit 220b includes a set of anti-fuses that may be programmed (i.e., shorted or not shorted) to represent the address of another defective cell to be replaced. Anti-fuse circuit 220b also includes supporting circuitry that provides a programmed address for a redundant cell 240b based on the programmed state of the anti-fuses. An address comparator 230b receives the redundant address from anti-fuse circuit 220b and the external address and activates a second word line RWL_B for redundant memory cell 240b if the two addresses match.

For the design shown in FIG. 2, each redundant memory cell is associated with either a fuse circuit or an anti-fuse circuit that generates the programmed address for the redundant cell. As noted above, the fuses within the fuse circuit are typically programmed (e.g., blown) during the wafer test phase of the manufacturing process. Wafer test is typically a slow process, but may be able to detect approximately 90% of all defective cells. Any redundant cell associated with a fuse circuit and not programmed during the wafer test phase typically becomes unusable thereafter.

Correspondingly, the anti-fuses within the anti-fuse circuit are typically programmed (e.g., shorted) during the final (package) test phase. If an insufficient number of redundant cells with anti-fuses is available during final test to replace newly detected defective cells, then the entire memory device is typically rejected (even though additional redundant cells with fuses are available on the device, since these fuses typically cannot be programmed during final test).

The fuses and anti-fuses are thus typically available only during the wafer test and final test phases, respectively. Any attempt to make both of the fuses and anti-fuses available for a particular test phase (e.g., wafer test) would likely be very challenging in a manufacturing environment.

An aspect of the invention provides a redundant circuit that includes a combination of fuses and anti-fuses, and which may be programmed during various phases of the manufacturing process (e.g., during wafer test or final test) to replace a defective circuit. For an implementation in a memory device, the redundant circuit comprises a "fuse and anti-fuse" circuit, an address comparator, and a redundant cell. In a general sense, the redundant circuit includes (1) a replacement circuit (e.g., a memory cell) that can be used to replace a defective circuit, and (2) supporting circuitry for the replacement circuit, which includes a combination of fuses and anti-fuses. The redundant circuit of the invention can be efficiently fabricated within a memory device but may also be used for other circuits and applications.

Figure 3:
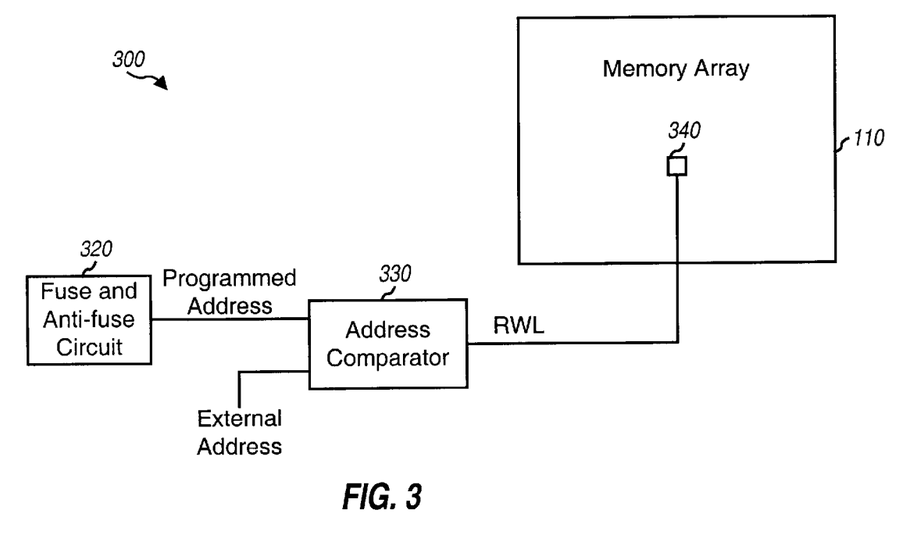
FIG. 3 is a block diagram of a memory array architecture that employs a redundant memory cell having an address that may be programmed with fuses or anti-fuses.

FIG. 3 is a block diagram of a memory array architecture 300 that employs a redundant memory cell having an address that may be programmed with fuses or anti-fuses, in accordance with an aspect of the invention. In the embodiment shown in FIG. 3, a fuse and anti-fuse circuit 320 includes a set of fuses and a set of anti-fuses, either of which may be programmed to represent the address of a defective cell to be replaced. Circuit 320 further includes supporting circuitry that provides a programmed address for a redundant cell 340 based on the programmed states of the fuses and anti-fuses, as described in further detail below. An address comparator 330 receives the programmed address from circuit 320 and an external address, compares the two addresses, and activates a word line RWL for redundant memory cell 340 if the two addresses match.

Figure 4:
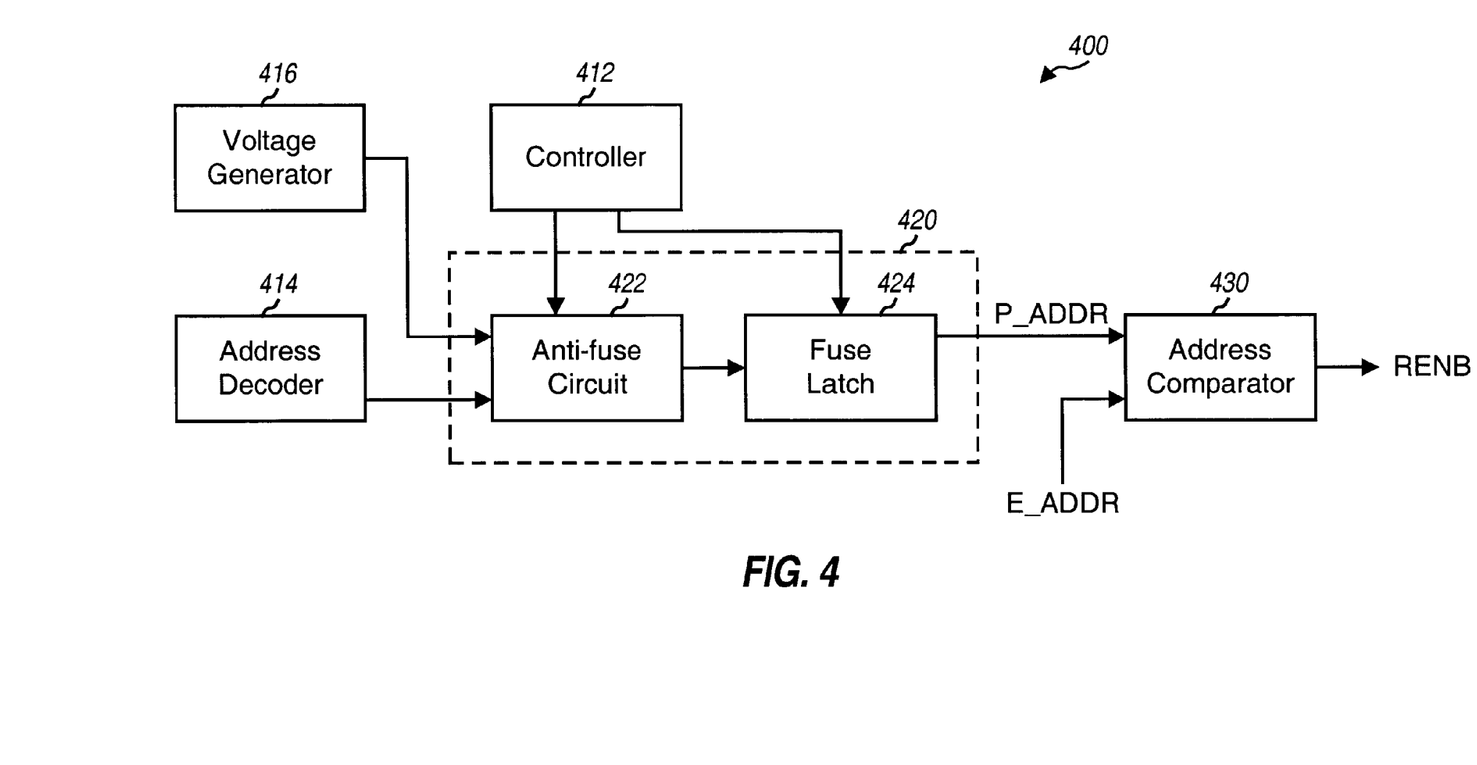
FIG. 4 is a block diagram of an embodiment of a redundant circuit that includes a combination of fuses and anti-fuses and further supports their programming and sensing.

FIG. 4 is a block diagram of an embodiment of a redundant circuit 400 that includes fuses and anti-fuses and further supports their programming and sensing. Redundant circuit 400 includes a controller 412, an address decoder 414, a voltage generator 416, a fuse and anti-fuse circuit 420, and an address comparator 430. Circuit 420 and comparator 430 respectively correspond to circuit 320 and comparator 330 in FIG. 3, and form the support circuitry for one redundant memory cell. Controller 412, address decoder 414, and voltage generator 416 are typically shared with the support circuitry for other redundant cells.

Controller 412 directs the programming of the anti-fuses while the memory device is operated in a test mode, and further directs the sensing of the programmed values for the fuses and anti-fuses when the memory device is reset or powered on, as described in further detail below. Address decoder 414 activates the signals that enable the programming the anti-fuses. The particular enable signals to be activated are dependent on the desired programmed values for the anti-fuses, which then represent the address of the defective memory cell to be replaced. Voltage generator 416 generates a control signal used to initiate the programming of the anti-fuses and a high voltage used to program (i.e., short) the anti-fuses.

In the specific embodiment shown in FIG. 4, fuse and anti-fuse circuit 420 includes an anti-fuse circuit 422 coupled to a fuse latch 424. Anti-fuse circuit 422 includes a set of anti-fuses that may be programmed based on an address provided by address decoder 414. The number of anti-fuses included in anti-fuse circuit 422 is dependent on the width of the programmed address for the redundant cell. For example, ten anti-fuses would be provided for a 10-bit address. For each address bit, anti-fuse circuit 422 provides a control signal indicative of whether or not the anti-fuse for that address bit has been shorted (i.e., the programmed value for that address bit).

Fuse latch 424 includes set of fuses that may also be programmed (e.g., via a laser). Fuse latch 424 further includes support circuitry that (1) receives the control signals for the anti-fuses and (2) (e.g., when reset or at power up) detects and latches the programmed address for the redundant cell based on the states of the fuses and anti-fuses. Anti-fuse circuit 422 and fuse latch 424 are described in further detail below.

Figure 5A:
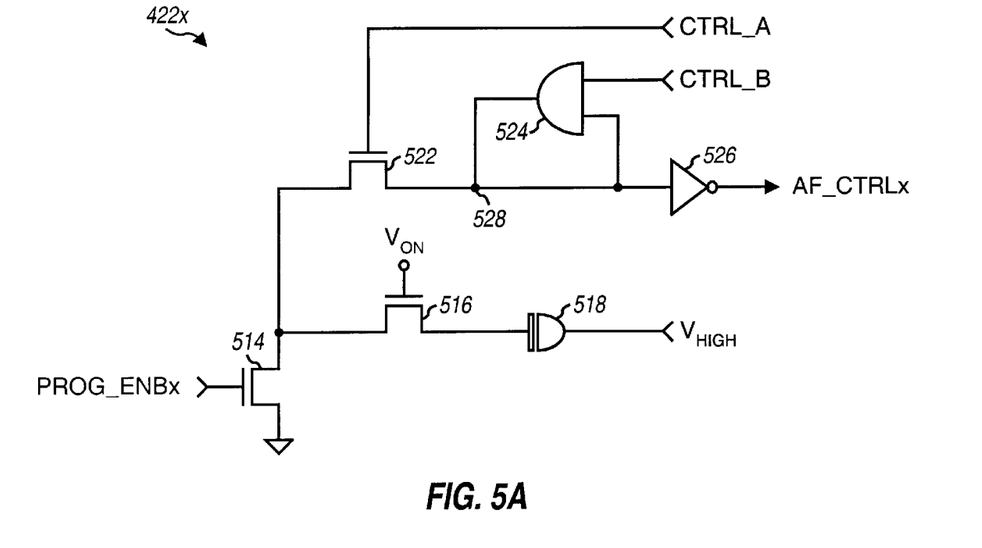
FIGS. 5A and 5B are schematic diagrams of an embodiment of an anti-fuse circuit and a fuse latch, respectively, for one address bit.

FIG. 5A is a schematic diagram of an embodiment of an anti-fuse circuit 422x, which includes one anti-fuse and may be used for one address bit. Anti-fuse circuit 422 in FIG. 4 typically includes a number of anti-fuse circuits 422x, one circuit 422x for each bit of the programmed address for the memory cell.

In the embodiment shown in FIG. 5A, anti-fuse circuit 422x includes a program path for programming the anti-fuse and a sense path for sensing the programmed value of the anti-fuse. The program path for the anti-fuse includes an N-channel pull-down transistor 514, an N-channel pass transistor 516, and an anti-fuse 518. The sense path for the anti-fuse includes transistor 516, anti-fuse 518, an N-channel pass transistor 522, an AND gate 524, and an inverter 526.

In the program path, the gate of transistor 514 receives a program enable signal PROG_ENBx, the source of transistor 514 couples to ground, and the drain couples to the source of pass transistor 516. The gate of transistor 516 receives a high voltage $V_{ON}$ and the drain couples to one end of anti-fuse 518. The other end of anti-fuse 518 couples to a high voltage $V_{HIGH}$ used for programming and sensing the anti-fuse.

The programming of the anti-fuse is achieved as follows. The program enable signal PROG_ENBx is pulsed high when programming of the anti-fuse is enabled, and transistor 514 is turned ON during this high pulse. Pass transistor 516 is normally turned ON (i.e., $V_{ON}$ is a high value) and a high voltage (e.g., 5–7 volts) is provided for $V_{HIGH}$ during the programming phase. These conditions result in a (relatively) large current flow across anti-fuse 518, which causes the anti-fuse to short. Anti-fuse 518 thereafter remains programmed in this shorted state indefinitely.

In the sense path, pass transistor 522 receives a first control signal CTRL_A at its gate, has its source coupled to the source of transistor 516, and has its drain coupled to node 528. AND gate 524 has one of its inputs and its output coupled to node 528 and further receives a second control signal CTRL_B at its other input. Inverter 526 has its input coupled to node 528, and its output provides the anti-fuse control signal AF_CTRLx.

Figure 5B:
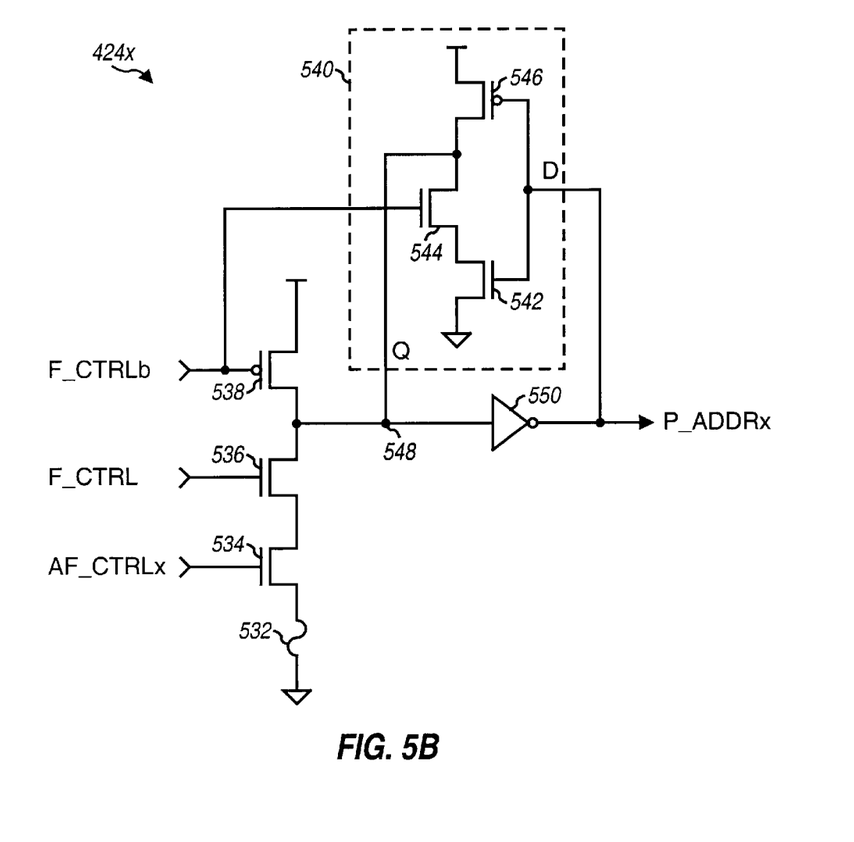
Figure 5C:
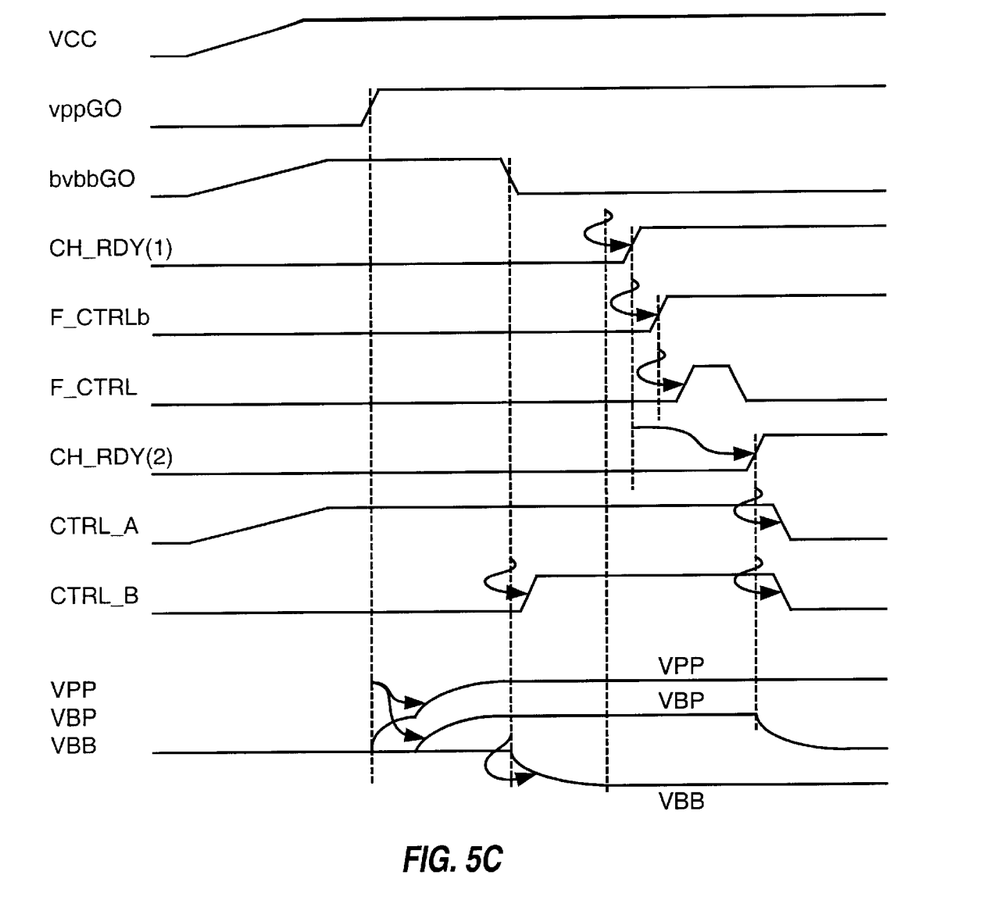
FIG. 5C is a timing diagram for the control signals used to sense the anti-fuse and to detect the programmed values of the fuse and anti-fuse.

FIG. 5C is a timing diagram for the control signals used to sense the programmed value for the anti-fuse, which is achieved as follows. At all times other than when programming of the anti-fuse is enabled, the program enable signal PROG_ENBx is logic low and transistor 514 is turned OFF. Initially, a high voltage is provided for $V_{HIGH}$ during the sensing phase and the control signals CTRL_A and CTRL_B are both at logic low, which causes node 528 to be at logic low. The control signal CTRL_A is then brought high, which turns on transistor 522. If anti-fuse 518 has been shorted by previous programming, the high voltage at $V_{HIGH}$ brings node 528 to logic high. Otherwise, anti-fuse 518 is open and node 528 remains at logic low. The value at node 528 is thus indicative of the programmed state of anti-fuse 518. Prior to the control signals CTRL_A and CTRL_B transitioning to logic low, the programmed value of the anti-fuse is latched by fuse-latch 424x, as described in further detail below.

FIG. 5B is a schematic diagram of an embodiment of a fuse latch 424x, which includes one fuse and may be used for one address bit. Fuse latch 424 in FIG. 4 typically includes a number of fuse latches 424x, one fuse latch 424x for each bit of the redundant memory cell's address.

In the embodiment shown in FIG. 5B, fuse latch 424x includes a fuse 532, N-channel transistors 534 and 536, and a P-channel transistor 538 coupled in series. The gate of transistor 534 receives the control signal AF_CTRLx from an associated anti-fuse circuit 422x, and the gates of transistors 536 and- 538 receive the control signals F_CTRL and F_CTRLb, respectively, from controller 412. An inverter 550 has its input coupled to a node 548, which is formed by the interconnection of the drains of transistors 536 and 538. The output of inverter 550 provides the control signal P_ADDRx, which comprises one programmed address bit for the redundant memory cell. A latch 540 has a data output (Q) that couples to node 548, a strobe input that receives the control signal F_CTRLb, and a data input that couples to the output of inverter 550.

Latch 540 includes N-channel transistors 542 and 544 and a P-channel transistor 546 coupled in series. The gates of transistors 542 and 546 couple together and form the data input for the latch. The drains of transistors 544 and 546 couple together and form the data output for the latch, and the gate of transistor 544 is the strobe input.

FIG. 5C also shows the control signals for sensing the programmed values of the anti-fuse in anti-fuse circuit 422x and the fuse in fuse latch 424x. Typically, the programmed values of the fuse and anti-fuse are sensed when the device is reset or powered on, and the detected value is latched and used until the device is reset or powered off.

Referring back to FIG. 5B, the control signal AF_CTRLx from anti-fuse circuit 422x is received by transistor 514, and is in either the logic high or logic low state depending on whether or not the anti-fuse has been shorted by a previous programming cycle. If control signal AF_CTRLx is at logic high (which turns ON transistor 534) and fuse 532 has not been blown, the source of transistor 536 is effectively grounded. Otherwise, if the control signal AF_CTRLx is at logic low or fuse 532 has been blown, the source of transistor 536 floats.

As shown in FIG. 5C, the control signal F_CTRLb is initially at logic low, which turns ON transistor 538 and pulls node 548 to logic high. The control signal F_CTRLb then transitions to logic high and the logic high at node 548 is temporarily retained. Shortly thereafter, the control signal F_CTRL also transitions to logic high, which turns ON transistor 536. If the source of transistor 536 is grounded (i.e., the control signal AF_CTRLx is at logic high and fuse 532 has not been blown), node 548 is pulled to logic low by transistor 536. Otherwise, if the source of transistor 536 is floating (i.e., the control signal AF_CTRLx is at logic low or fuse 532 has been blown), node 548 retains the high logic. Thus, the value on node 548 is dependent on the programmed states of the fuse and anti-fuse.

While both control signals F_CTRL and F_CTRLb are at logic high, the logic value on node 548 is propagated through inverter 550 and stored to latch 540. For example, if node 548 is at logic low, the output of inverter 550 is logic high, transistor 542 is turned ON, transistor 544 is already turned ON by the control signal F_CTRLb being at the logic high, and node 548 is thus pulled low by transistors 542 and 544. Alternatively, if node 548 is at logic high, the output of inverter 550 is logic low, transistor 546 is turned ON, transistor 542 is turned OFF, and node 548 is pulled high by transistor 546. When the control signal F_CTRL transitions back to logic low, transistor 536 is turned OFF and the value at node 548 is stored until the next sensing operation. Latch 540 thus retains the programmed value of the fuse and anti-fuse, which is provided from inverter 550 via the address line P_ADDRx.

Figure 6:
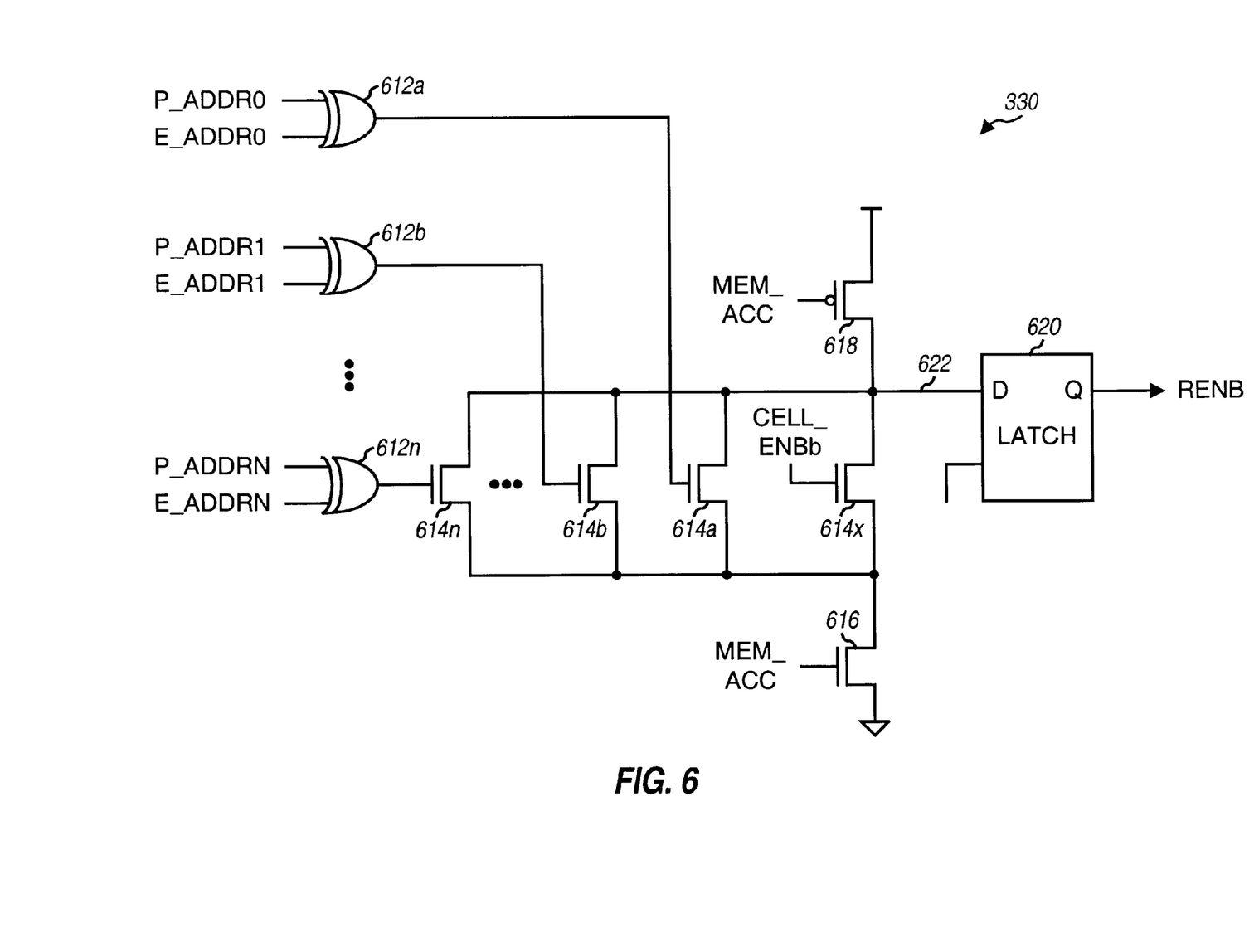
FIG. 6 is a schematic diagram of an embodiment of an address comparator for one redundant memory cell.

FIG. 6 is a schematic diagram of an embodiment of address comparator 330, which supports one redundant memory cell. Address comparator 330 receives an N-bit programmed address P_ADDR from N fuse latches 424x within fuse and anti-fuse circuit 320 and an N-bit external address E_ADDR. Each pair of corresponding programmed and external address bits is provided to the inputs of a respective exclusive-OR gate 612. The output of exclusive-OR gate 612 is logic low if the two address bits match and logic high otherwise.

Each of the N exclusive-OR gates 612 drives a respective N-channel transistor 614. The N transistors 614a through 614n, along with an additional N-channel transistor 614x, couple in parallel and effectively form an (N+1)-input NOR gate. The gate of transistor 614x receives a signal CELL_ENBb that indicates whether or not this redundant cell has been programmed to replace a defective cell. The enable signal CELL_ENBb is logic low to enable the redundant memory cell and logic high otherwise. The parallel combination of transistors 614 couples in series with an N-channel transistor 616 and a P-channel transistor 618.

If all N pairs of address bits match, indicating that the external address matches the programmed address of the redundant cell, the outputs from all N exclusive-OR gates 612 are at logic low. And if the signal CELL_ENBb is also at logic low (i.e., enabled), all N+1 transistors 614 are opened. For each memory access operation, a control signal MEM_ACC is initially at logic low, which turns ON transistor 618 and initializes node 622 to logic high. The control signal MEM_ACC is then pulsed to logic high for a short time period (e.g., one nsec). During this high pulse, transistor 616 is turned ON and transistor 518 is turned OFF. If all transistors 614 are opened, indicating that the memory access of the redundant cell is enabled, node 622 remains at logic high. Otherwise, if the addresses do not match or the redundant cell has not been enabled (i.e., by CELL_ENBb), at least one of transistors 614 is shorted and node 622 is brought to logic low.

A latch 620 latches the value at node 622. If the programmed and external addresses match and the redundant cell has been programmed to replace a defective cell, latch 620 provides the control signal RENB that activates the word line for the redundant cell and de-activates the word line for the defective cell.

Figure 7:
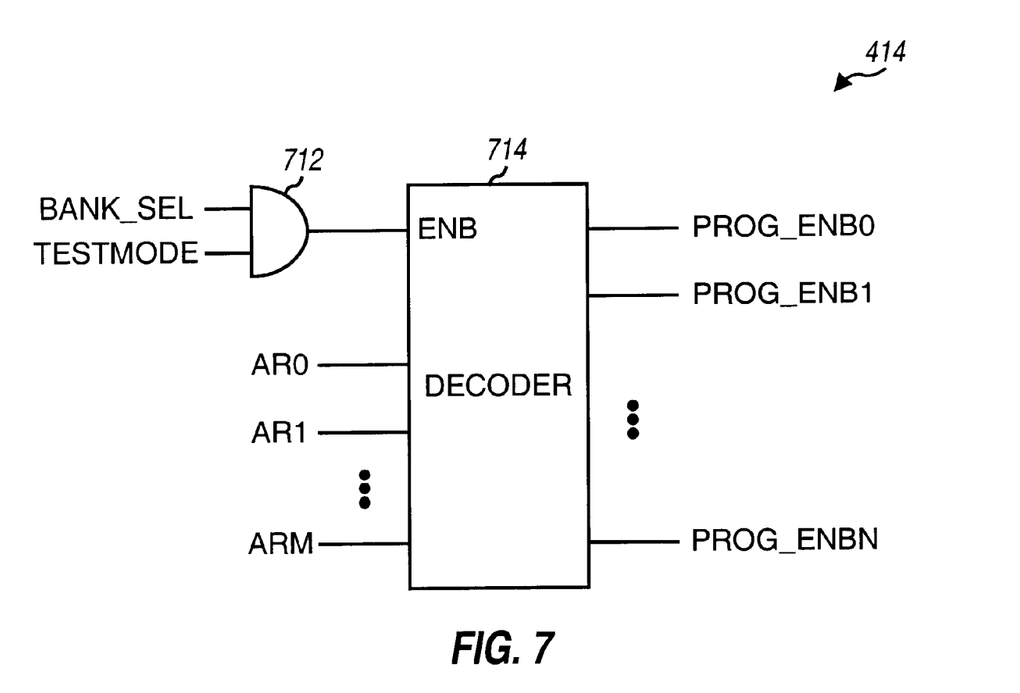
FIG. 7 is a diagram of an embodiment of an address decoder for generating the enable signals for programming the anti-fuses.

FIG. 7 is a diagram of an embodiment of address decoder 414 used to generate the program enable signals PROG_ENB for programming the anti-fuses for one redundant memory cell. Address decoder 414 includes an AND gate 712 coupled to a decoder 714. AND gate 712 receives the control signals BANK_SEL and TESTMODE and provides an enable signal for decoder 714 if (1) the memory device is placed in the test mode (during which programming of the anti-fuses is allowed) and (2) the memory bank supported by decoder 714 is selected for programming. Otherwise, decoder 714 is disabled.

Decoder 714 further receives an input address AR indicative of the values to be programmed for the anti-fuses (i.e., the programmed address for the redundant cell). Based on the input address AR, decoder 714 activates selected ones of the program enable signals PROG_ENB0 through PROG_ENBN for the N anti-fuses such that the programmed values for the anti-fuses reflect the desired address for the redundant cell. Typically, due to current constraint and power dissipation considerations, one anti-fuse is selected for programming at any given time. Decoder 714 thus sequences through the programming of the N anti-fuses (e.g., selectively activating PROG_ENB0, then selectively activating PROG_ENB1, and so on).

Figure 8:
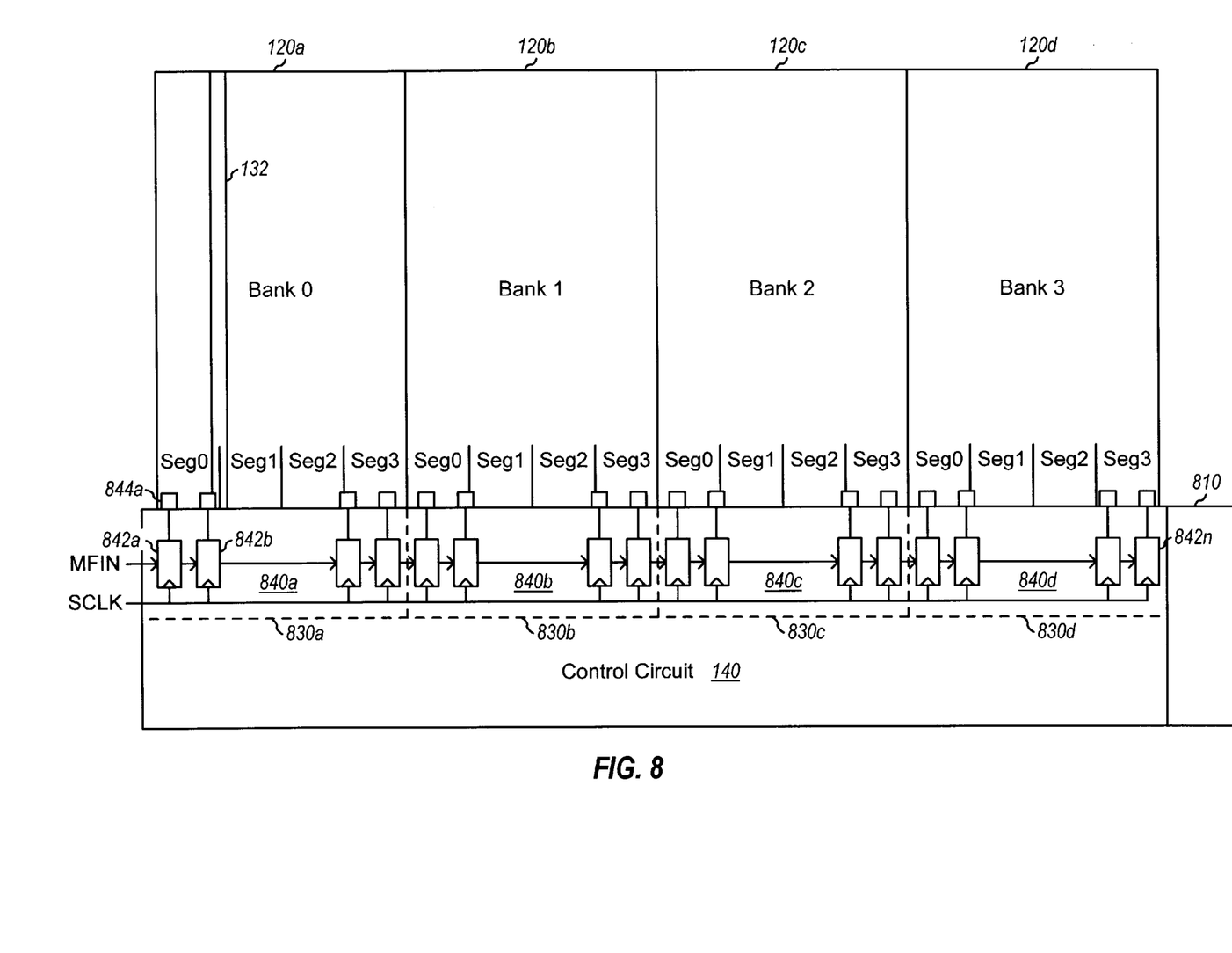
FIG. 8 is a diagram of a specific implementation of the redundant circuits within the memory device architecture shown in FIG. 1.

FIG. 8 is a diagram of a specific implementation of the redundant circuits within the memory device architecture shown in FIG. 1. For simplicity, FIG. 8 shows one of the four memory arrays 110 in memory device 100. In an embodiment, memory array 110 includes four memory banks 120*a* through 120*d*, and each memory bank 120 further is partitioned into four segments 130.

In an embodiment, the redundant memory cells are distributed over the memory array and each segment 130 is associated with a respective redundant array 132. Each redundant array 132 includes a number of redundant memory cells that may be used to replace defective memory cells in one or more associated memory segments 130. The redundant cells from a particular redundant array 132 may be designed to replace defective cells from one associated segment, or may be designed with the capability to replace defective cells in two or more segments.

The number and type of redundant cells to be included in each redundant array 132 is dependent on various factors. In one example design, 12 or more redundant cells may be included in each redundant array 132, of which 8 or more redundant cells may be programmed with fuses and 4 or more redundant cells may be programmed with fuses/anti-fuses. This combination may provide a good tradeoff between flexibility and die area. In another design, the redundant array for one segment may include 8 or more redundant cells that may be programmed with fuses, the redundant array for the adjacent segment may include 8 or more redundant cells that may be programmed with fuses/anti-fuses, and so on.

The specific memory design in FIG. 8 is provided as an illustration. Other memory designs with different configurations and arrangements of arrays, banks, and segments may also be contemplated and are within the scope of the invention. Moreover, other distributions of redundant cells may also be contemplated and are also within the scope of the invention.

In an embodiment, the supporting circuitry for redundant arrays 132 is also distributed over the memory array, and the redundant arrays 132 for each memory bank 130 are associated with a respective support circuitry block 830 (which is implemented within control circuit 140). In an embodiment, each support circuitry block 830 includes the anti-fuse circuits, fuse latches, and address comparators for the redundant cells supported by that support circuitry block. Support circuitry blocks 830 may be implemented in fine pitch. A control circuit 810 provides the necessary control signals to program the anti-fuses, sense the fuses and anti-fuses, and operate support circuitry blocks 830. Control circuit 810 may include controller 412, address decoder 414, and voltage generator 416 shown in FIG. 4.

Typically, either the fuse or anti-fuse of the redundant circuit is programmed, if at all. The fuse is typically programmed during a wafer test and, if the fuse has not been programmed, the anti-fuse may be programmed during a final test. A bit may be used to indicate whether or not the fuse has been programmed so that the programming of the anti-fuse may be enabled.

In an embodiment, each redundant memory cell is associated with a respective "master fuse" bit that indicates whether or not the fuses have been programmed for the redundant cell to replace a defective memory cell. The anti-fuses for the redundant cell are only enabled for programming if the master fuse bit indicates that the fuses for this cell have been not been programmed. The master fuse bit for each redundant cell can be generated by a master fuse 844 that is also programmed at the time the fuses for the cell are programmed.

FIG. 8 also shows an embodiment wherein the master fuse bits for the redundant cells in the memory array are located below the memory array, and the values of the master fuse bits are stored to a set of registers 842 during a test mode. The master fuse bits stored in registers 842 can thereafter be used to enable the programming of the anti-fuses for the redundant cells.

In an embodiment, to reduce the number of lines needed to provide the master fuse bits, registers 842 are operated as a shift register that appropriately shifts in the master fuse bits provided from another location of the memory device. With this design, only two lines (i.e., a data line and a clock line) are needed to shift in P master fuse bits for the P redundant cells, where P can be any integer. The data line and clock line may also be borrowed from other lines that are already available within control circuit 140.

As shown in FIG. 8, the master fuse bits are provided to a first shift register 842*a* via a signal line MFIN. Each clock cycle causes the master fuse bit to be shifted to the right by one register. P clock cycles are used to shift in P master fuse bits. After all P master fuse bits have been shifted in, the clock signal (or an enable signal for the registers) may be disabled to retain the master fuse bits. Thereafter, each register 842 provides a respective enable signal to a corresponding address decoder 414, which uses this enable signal to generate the program enable signal PROG_ENB, as shown in FIGS. 5A and 7.

To ensure that the timing for the shift register is properly met and to prevent against a race condition, delay elements (e.g., two inverters) may be provided between each pair of registers 842. The P registers 842 may also be partitioned such that a set of registers 840 is associated with each memory bank 120, and each set of registers may be driven by a respective clock signal. To ensure that the timing for the (e.g., four) sets of registers is properly met and to prevent against a race condition between the sets, delay elements (e.g., four inverters) may be provided between successive sets of registers (i.e., between sets 840a and 840b, between sets 840b and 840c, and between sets 840c and 840d).

Figure 9:
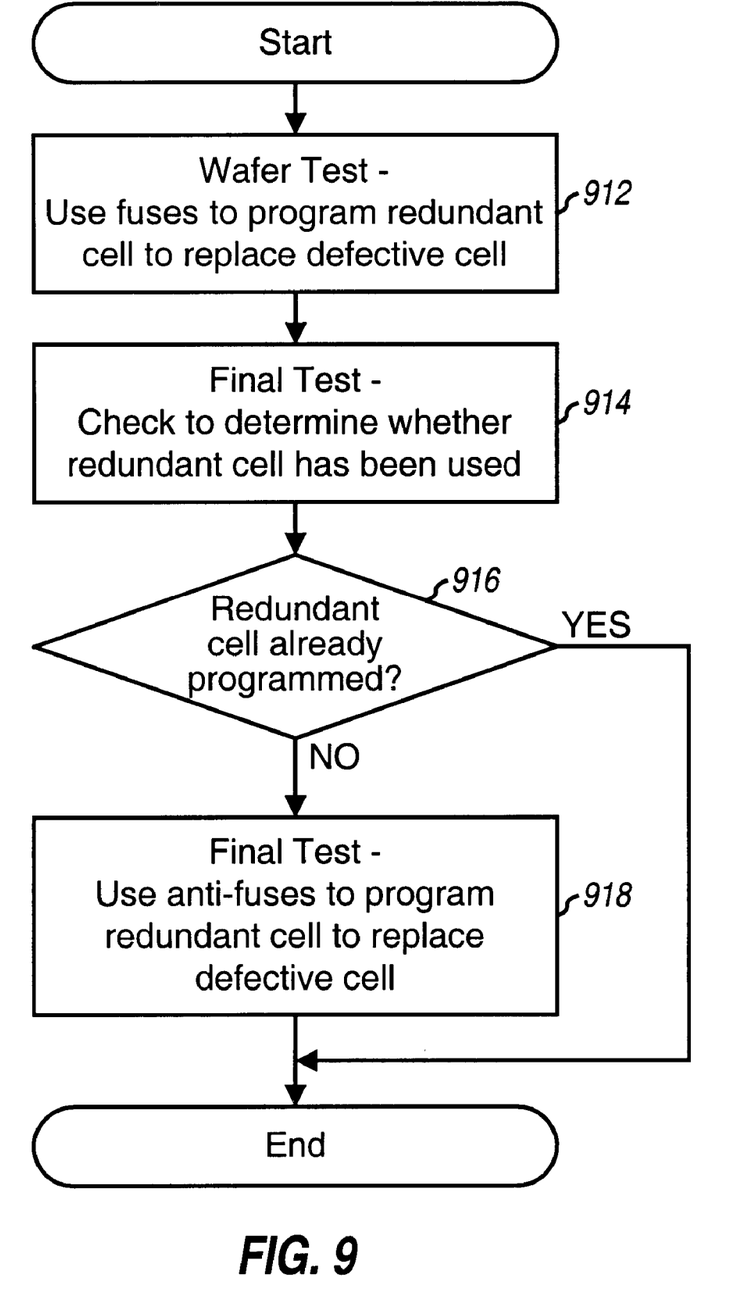
FIG. 9 is a simple flow diagram of the programming of a redundant circuit of the invention.

FIG. 9 is a simple flow diagram of the programming of a redundant circuit of the invention. As noted above, the redundant circuit includes fuses and anti-fuses and may be programmed at various phases of the manufacturing process. During wafer test, the fuses may be used to program a redundant cell to replace a defective cell, at step 912. A master fuse is also typically blown to indicate that the redundant cell has been programmed for use.

At final test (e.g., package test), a check is first made whether the redundant cell has already been programmed, at step 914. This check may be achieved by sensing the programmed value of a master fuse, as described above. Referring back to FIG. 5B, the master fuse may be sensed by applying a logic high on the control signal AF_CTRLX and latching the value at node 548. If the master fuse has been programmed (i.e., blown), the value on node 548 is logic high, and the output of inverter 550 is at logic low, which indicates that the fuses for the redundant cell have already been programmed.

If the redundant cell is determined to be programmed, at step 916, the anti-fuses for this cell cannot be used and the programming process terminates. Otherwise, the anti-fuses may be used to program the redundant cell to replace a defective cell, at step 918. The programming process for this redundant cell then terminates.

The redundant circuit described herein may be implemented within a stand-alone integrated circuit (IC) such as, for example, a dynamic random access memory (DRAM) IC, a synchronous graphics RAM (SGRAM), and other memory devices. The redundant circuit may also be used for other types of devices such as a processor, a controller, a digital signal processor (DSP), an application specific integrated circuit (ASIC), and others. The redundant circuit described herein may also be implemented for a memory array that is embedded within an integrated circuit such as, for example, central processing unit (CPU).

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein, and as defined by the following claims.

What is claimed is:

1. A redundant circuit comprising:
    a replacement circuit configurable to replace a defective circuit; and
    a support circuit coupled to the replacement circuit and configurable to provide a control signal for the replacement circuit, wherein the support circuit includes at least one fuse and at least one anti-fuse, and wherein the control signal is determined based on states of the at least one fuse and the at least one anti-fuse.

2. The redundant circuit of claim 1, wherein either the at least one fuse or the at least one anti-fuse is programmed to provide a programmed value for the replacement circuit.

3. The redundant circuit of claim 2, wherein the replacement circuit is a redundant memory cell.

4. The redundant circuit of claim 3, wherein the programmed value is indicative of an address for the redundant memory cell.

5. The redundant circuit of claim 1, wherein the support circuit includes
    a first circuit having included therein the at least one anti-fuse, wherein the first circuit is further configurable to program the at least one anti-fuse or sense a state of the at least one anti-fuse.

6. The redundant circuit of claim 1, wherein the support circuit further includes
    a master fuse programmable to provide an indication of a status of the redundant circuit.

7. The redundant circuit of claim 1, wherein the at least one fuse is programmable via a first programming method and the at least one anti-fuse is programmable via a second programming method.

8. The redundant circuit of claim 7, wherein each fuse is programmed to a first state by blowing the fuse and each anti-fuse is programmed to the first state by electrically shorting the anti-fuse.

9. A DRAM device comprising a plurality of redundant circuits of claim 1.

10. A redundant circuit comprising:
    a replacement circuit configurable to replace a defective circuit; and
    a support circuit coupled to the replacement circuit and configurable to provide a control signal for the replacement circuit, wherein the support circuit includes
    a first circuit having included therein at least one anti-fuse, wherein the first circuit is further configurable to program the at least one anti-fuse or sense a state of the at least one anti-fuse, and
    a second circuit coupled to the first circuit and including at least one fuse, wherein the second circuit is further configurable to sense a state of the at least one fuse, receive the sensed state of the at least one anti-fuse, and provide a programmed value indicative of the sensed states of the at least one fuse and the at least one anti-fuse.

11. The redundant circuit of claim 10, wherein the support circuit further includes
    a third circuit coupled to the second circuit and configured to receive the programmed value and provide the control signal for the replacement circuit.

12. The redundant circuit of claim 11, wherein the third circuit is configured to compare the programmed value with an external value, and wherein the control signal is generated based on a status of the redundant circuit and a result of the compare.

13. A redundant circuit for a memory device, comprising:

a redundant memory cell configurable to replace a defective memory cell;

a first circuit configurable to provide a programmed address for the redundant memory cell, wherein the first circuit includes a set of fuses and a set of anti-fuses programmable to provide the programmed address; and an address comparator operatively coupled to the first circuit and the redundant memory cell, the address comparator configured to compare the programmed address and an external address and activate a control line for the redundant memory cell based at least in part on a result of the compare.

14. The redundant circuit of claim 13, wherein the control line for the redundant memory cell is activated if the programmed address matches the external address and a status bit indicates that the redundant memory cell has been programmed to replace the defective memory cell.

15. A dynamic random access memory (DRAM) device comprising a plurality of redundant circuits, each redundant circuit including a redundant memory cell configurable to replace a defective memory cell, a first circuit configurable to provide a programmed address for the redundant memory cell, wherein the first circuit includes a set of fuses and a set of anti-fuses programmable to provide the programmed address, and an address comparator operatively coupled to the first circuit and the redundant memory cell, the address comparator configured to compare the programmed address and an external address and activate a control line for the redundant memory cell based at least in part on a result of the compare.

16. The DRAM device of claims 15, wherein the plurality of redundant circuits are distributed over the device.

17. The DRAM device of claims 15, further comprising:

a plurality of memory banks, each memory bank including a plurality of memory cells; and a plurality of redundant arrays, each redundant array including a plurality of redundant memory cells.

18. The DRAM device of claims 17, wherein each redundant array is associated with one memory bank, and wherein the plurality of redundant memory cells within each redundant array are configurable to replace defective memory cells within the associated memory bank.

19. The DRAM device of claims 17, wherein each memory bank is further partitioned into a plurality of segments, wherein each redundant array is associated with one or more memory segments, and wherein the plurality of redundant memory cells within each redundant array are configurable to replace defective memory cells within the one or more associated memory segments.

20. The DRAM device of claims 15, further comprising:

a plurality of registers, each register associated with a respective redundant memory cell and configured to store a status value for the redundant memory cell.

21. The DRAM device of claims 20, wherein the status value for a particular redundant memory cell is indicative of whether or not the redundant memory cell has previously been programmed to replace a defective memory cell.

22. The DRAM device of claims 20, wherein the plurality of registers are operated as a shift register, and wherein status values for a plurality of redundant memory cells are stored in the plurality of registers by serially shifting the status values into the registers.

23. A method for programming a replacement circuit to replace a defective circuit, the method comprising:

if replacement of the defective circuit with the replacement circuit is selected, programming a set of fuses or a set of anti-fuses to provide a programmed value for the replacement circuit, wherein the programming includes programming the set of fuses if the replacement circuit is selected to replace the defective circuit at a first time instant, determining whether or not the set of fuses has been programmed, and programming the set of anti-fuses if the replacement circuit is selected to replace the defective circuit at a second time instant and the set of fuses has not been programmed.

24. A method for replacing a defective circuit with a replacement circuit, the method comprising:

sensing a programmed value for the replacement circuit, wherein the programmed value is indicative of states of a set of fuses and a set of anti-fuses previously programmed for the replacement circuit;

providing an indication to activate the replacement circuit based at least in part of the programmed value; and activating the replacement circuit in response to the received indication.

25. The method of claim 24, wherein the providing includes comparing the programmed value with an external value to generate the indication to activate the replacement circuit.

26. The method of claim 24, further comprising:

latching the sensed programmed value for the replacement circuit for subsequent use to generate the indication to activate the replacement circuit.

* * * * *